United States Patent [19]
Murofushi et al.

[11] Patent Number: 5,913,101
[45] Date of Patent: Jun. 15, 1999

[54] SEMICONDUCTOR DEVICE MANUFACTURING METHOD BY CARRYING OUT LOGIC DESIGN

[75] Inventors: Masako Murofushi, Yokohama; Takashi Ishioka, Kawasaki, both of Japan

[73] Assignee: Kabushiki Kaisha Toshiba, Kawasaki, Japan

[21] Appl. No.: 08/834,272

[22] Filed: Apr. 15, 1997

[30]     Foreign Application Priority Data

Apr. 15, 1996 [JP] Japan .................................. 8-115252

[51] Int. Cl.⁶ .................................................. H01L 21/00
[52] U.S. Cl. .............................. 438/6; 438/129; 438/599
[58] Field of Search .................... 438/6, 10, 11, 438/128, 129, 598, 599

[56]     References Cited

U.S. PATENT DOCUMENTS

| | | | |
|---|---|---|---|
| 4,701,860 | 10/1987 | Madar ..................................... | 438/129 |
| 5,139,963 | 8/1992 | Suzuki et al. ............................... | 438/6 |
| 5,278,105 | 1/1994 | Eden et al. ................................ | 438/129 |
| 5,397,749 | 3/1995 | Igarashi ..................................... | 438/129 |

FOREIGN PATENT DOCUMENTS 7-86410  3/1995  Japan .

OTHER PUBLICATIONS

Keutzer, "Dagon: Technology Binding and Local Optimization by DAG Matching", *24th ACM/IEEE Design Automation Conference*, pp. 341–347, (1987).

Pedram et al., "Layout Driven Technology Mapping", *28th ACM/IEEE Design Automation Conference*, pp. 99–105, (1991).

"Layout Driven Logic Synthesis", pp. 17–19, (1992).

*Primary Examiner*—Chandra Chaudhari
*Attorney, Agent, or Firm*—Foley & Lardner

[57]     ABSTRACT

In order to modify a combination of logic gates based on relationships between physical locations of the logic gates in a semiconductor integrated circuit which has already been subjected to layout design in the middle of design of the semiconductor integrated circuit, circuit portions whose combination is to be modified are specified, then the circuit portions are transformed into logically equivalent intermediate representations (NAND2s, IVs, etc.), then a new combination of the logic gates is generated based on the intermediate representation, and then the prior combination of the logic gates is replaced with the new combination of the logic gates.

10 Claims, 14 Drawing Sheets

INTERMEDIATE REPRESENTATION 1

INTERMEDIATE REPRESENTATION 2
FIG.7
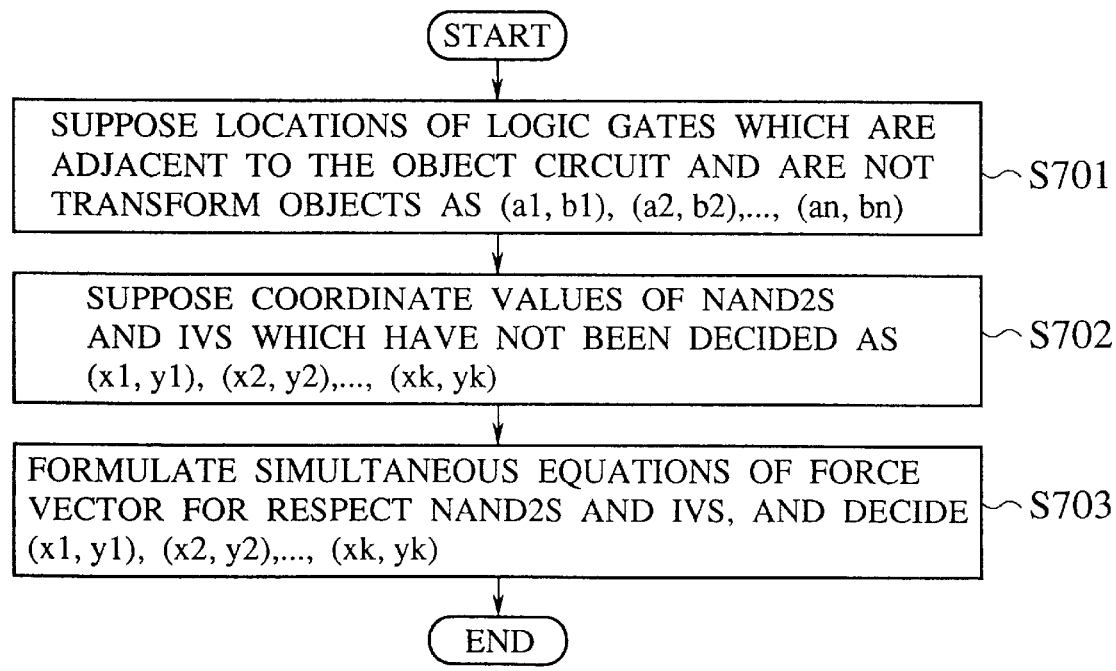

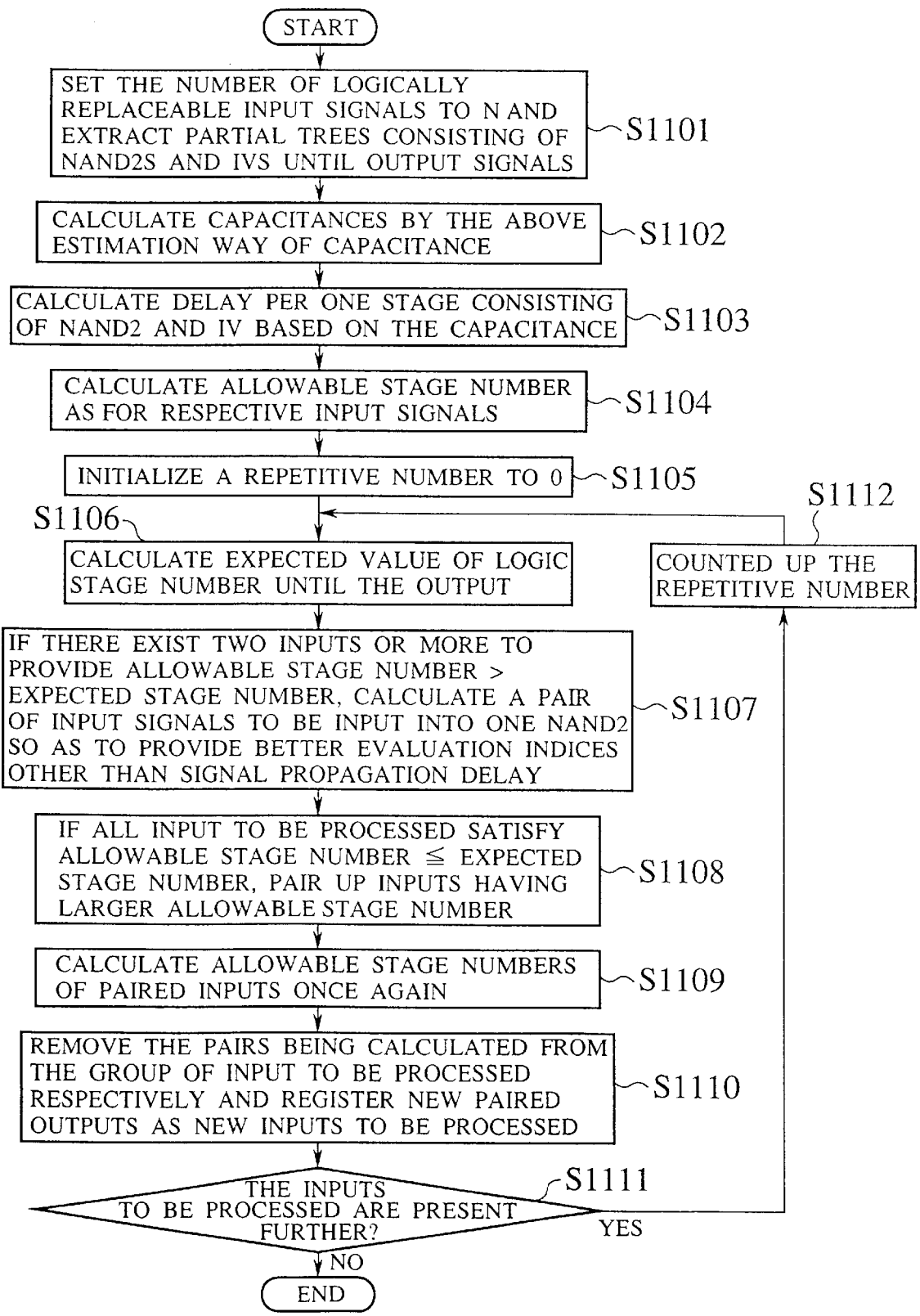

FIG.12A
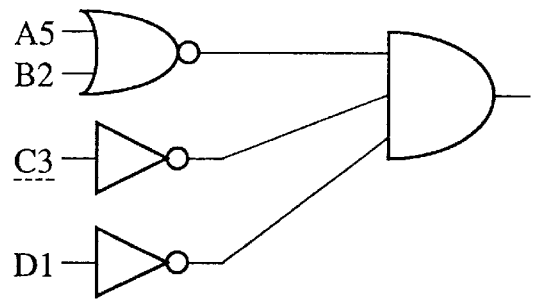
FIG.12B
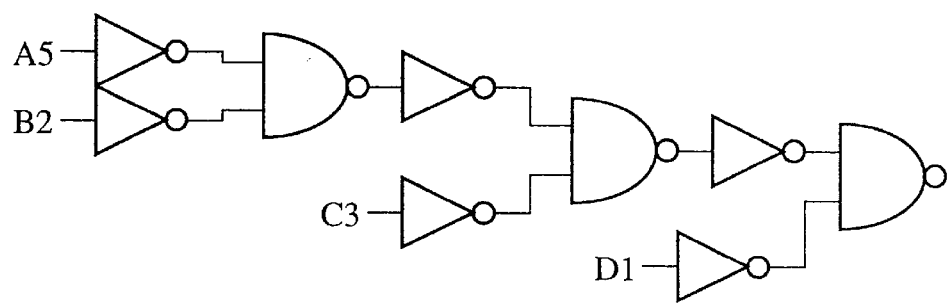
FIG.12C
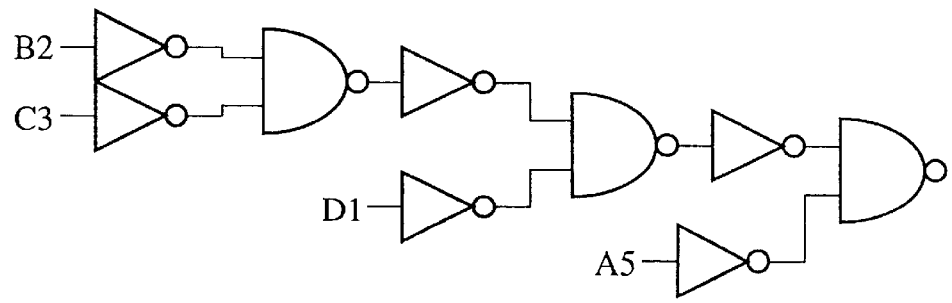

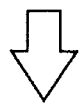

FIG.13C
| AND CIRCUIT | 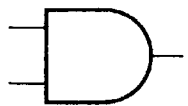 |
| --- | --- |
| EXOR CIRCUIT | 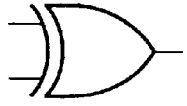 |
| NOR CIRCUIT |  |

SEMICONDUCTOR DEVICE MANUFACTURING METHOD BY CARRYING OUT LOGIC DESIGN

BACKGROUND OF THE INVENTION

1. Field of the Invention

The present invention relates to a semiconductor device manufacturing method and, more particularly, an approach to logic design for a semiconductor integrated circuit.

2. Description of the Related Art

The manufacture of semiconductor devices is advanced basically in compliance with a flowchart in FIG. 1 showing production processes. In other words, irrespective of difference between automatic design and manual design, the semiconductor devices can be designed via functional design process, logic design process, layout design process, device design process, circuit design process, and testing design process. In the functional design process, function specifications of the semiconductor integrated circuit are determined according to system specifications and then detailed operations of the semiconductor integrated circuit are designed. The architecture of the semiconductor integrated circuit such as bit widths/number of registers in logic blocks, number/usage of control lines and bus lines, type/usage of clock, etc. are determined via the functional design process. In the logic design process, the semiconductor integrated circuit is embodied up to a circuit level in units of logic gates such as NAND circuits, inverter circuits, etc. based on functional design data. In the logic design process, design will be made with interconnections between the logic gates, i.e., a logic circuit structure as its chief purpose. Basic logic gates used in the logic design process are selected from a menu in a logic cell library which has prepared in advance via the device design and the circuit design. Respective cells such as complex gate, flip-flop, tri-state driver in addition to simple basic logic gates are included on the scale of several to ten and over logic gates in the logic cell library.

In the logic design process, respective delay values of the logic gates which can be predicted based on their electrical performance are assigned to respective logic gates to run a delay simulation, so that elimination of logic error can be assured. However, since media delay, etc. which cannot be fixed until the layout design has been finished cannot sufficiently be evaluated at this stage, in many cases detailed simulation is done once again after the layout design to check firmly logic error. In the device design process, profile, electrical performance, etc. of transistors to be used can be designed according to manufacturing conditions of the semiconductor integrated circuit. Usually, proper transistors are selected from a transistor menu which corresponds to capability of the manufacturing line. But new transistors are designed if they are insufficient in performance. The circuit design process is made up of two procedures of basic circuit or circuit cell design and whole circuit design. The layout design process is most important throughout design processes of the semiconductor integrated circuit. The layout design process is an operation to design mask patterns for use in the semiconductor integrated circuits. With the use of the connectivity list obtained by the logic design process and the logic cell library which has been prepared by the circuit design process, placement and routing of the logic gates are accomplished. As for data collected after the layout design process has been terminated, electrical performance of the logic gates is verified by logic simulator, circuit simulator, or the like. The process then turns to the logic design process if any deficiency has been detected. The data are then transferred as the mask patterns to production process after the layout design process has been completed.

In the testing design process, testing patterns are designed to check whether or not the manufactured semiconductor integrated circuit has satisfied expected performance and function.

In turn, the process goes to the production testing process after the design processes have been completed. First, the chip manufacturing process is carried out in which chips are manufactured in accordance with manufacturing conditions. Then, the process advances to testing evaluation process in which the chips are evaluated according to the testing design process, whereby a product can be finished.

Logic synthesis process which is automated technology in the logic design process has been recognized as a design phase prior to layout design process. According to the logic synthesis circuits at detailed gate level can be constituted of descriptions at an upper level, e.g., descriptions at a register transfer level. In recent years, influence of routings on signal propagation delay, area of the semiconductor integrated circuit, and power consumption is being increased with the progress of miniaturization and high integration density of the semiconductor integrated circuit.

In order to avoid such influence, such an approach has been proposed that the logic synthesis process is tried once again with regard to the layout design (Link-to-Layout Logic Synthesis Approach, SYNOPSYS Corp.). However, the layout design process must be tried entirely once more since the logic synthesis process has to be reconsidered from the beginning in this approach. Therefore, such approach would result in certainly another placement and routing which are different from those obtained by the first logic synthesis.

Consequently, sometimes the logic synthesis process and the layout design process must be made over further more. In this manner, there can be no guarantee to converge such processes, so that a process time required for the logic synthesis process and the layout design process is increased several times. Thus, such approach would be inadvisable in respect of the process time.

Furthermore, another approach has also been proposed in which the logic synthesis process and the layout design process are carried out completely simultaneously (M. Pedram et al., "Layout Driven Logic Restructuring/Decomposition", ICCAD 91). However, since basic logic gates which are intermediate representations in the logic synthesis are placed as they are in this approach, the number of devices to be subjected to the layout design process is increased rather than the number of devices in usual design flow. Therefore, it takes a lot of process time to carry out the layout design process itself. Also it takes a lot of process time to carry out the logic synthesis process per se since the logic synthesis is advanced while performing the layout design of all the logic circuits. In addition, the synthesis results are the results of layout design in this approach, but there can be no guarantee of quality of the results of layout design. There is a possibility that the layout design process must be done over again to arrange the logic circuits in a small area.

As still another approach, in order to reduce influence of the routings on the signal propagation delay particularly, such technique has existed that the logic gates located in a part of the logic circuit are replaced, otherwise buffers are inserted into concerned parts after the layout design process has been effected once more (Patent Application No. Hei 5-227077, Laid-open No. Hei 7-86410). However, a combination of logic circuits to achieve function is not modified in this technique. Hence, appropriate improvements cannot be introduced in this technique such that in the area to which a plenty of routings are to be assigned, a combination of logic gates with fewer routings is employed to improve a routing complexity degree at a slight sacrifice of signal propagation delay, or conversely, in the area to which fewer routings are to be assigned, another combination of logic gates is employed to reduce signal propagation delay even if the number of routings are increased. In addition, the combination of logic gates cannot be modified to take account of minimization of a switching factor of the signal. In this manner, it is difficult only by replacing a part of the logic gates simply that the routing complexity degree may be relaxed or the semiconductor integrated circuit with low power consumption may be accomplished.

As an automatic logic synthesis approach in the prior art, there has been known a processing approach which is called "technology mapping". According to this automatic logic synthesis approach, abstract logic functions which do not have size and physical information and are composed of AND operator, OR operator, NOT operator are embodied by logic gates which have physical substance.

As an ordinary approach of the technology mapping such an approach has been proposed that logic functions composed of AND operators, etc. can be represented intermediately by two basic logic gates, i.e., NAND2s (two-input NAND circuits) and IVs (inverters) after the logic design process has been effected but before the layout design process is effected and thereafter the logic functions are replaced with the logic gates having physical substance by making use of DAG (Directed Acyclic Graph) mapping (Keutzer DAC' 87 DAGON: Technology Binding and Logic Optimization by DAG Mapping). However, in this approach, there has been a problem that the results of layout design process cannot be taken into account.

As design evaluation indices for the semiconductor integrated circuit, area (integration density), signal propagation delay time, power consumption, for example, may be considered. A smaller area of the semiconductor integrated circuit (i.e., higher integration density) can make the production cost lower. In addition, a shorter signal propagation delay time can make operation speed of the semiconductor integrated circuit higher. As a result, design of high performance semiconductor integrated circuit can be accomplished.

Furthermore, since smaller power consumption enables a longer time duration of the circuit if the circuit is incorporated into a battery-powered system, for example, higher facility can be attained. Still further, since the cost of design and package for heat radiation can be reduced, the semiconductor integrated circuit can be manufactured at low cost. It has been known that, at the stage that the logic design process has been terminated, it is difficult to estimate influence of routings on these evaluation indices precisely. Therefore, this fact has been a major factor to increase a design time of the semiconductor integrated circuit.

As for the area, it has been known empirically in layout design that a higher routing complexity degree makes routing itself more difficult and makes a rate of a routing area to a total area higher and in its turn brings about increase of the area. As for the signal propagation delay, there has existed influence of wiring capacitance on the signal propagation delay. As for the power consumption, increase of power consumption due to charge/discharge of wiring capacitance has been known.

With the above discussion, it would be important for design of the semiconductor integrated circuit with good evaluation indices to carry out logic resynthesis process with regard to the results of layout design process, more particularly, while estimating precisely routing complexity degree, wiring capacitance values, and in its turn final area (integration degree), signal propagation delay time, power consumption, etc. in the course of logic synthesis process.

SUMMARY OF THE INVENTION

The present invention has been made in light of the above circumstances, and it is an object of the present invention to provide a semiconductor device manufacturing method which is able to reduce the number of redesign caused by the difficulty of estimating the results of layout design in advance in the logic synthesis process and the design time per se, and is also able to design a highly integrated semiconductor integrated circuit which can operate at high speed and at low power consumption.

According to an aspect of the present invention, there is provided a semiconductor device manufacturing method comprising the steps of carrying out logic design of a semiconductor integrated circuit including plural logic gates; carrying out layout design of the semiconductor integrated circuit which is subjected to the logic design; selecting logic gates whose combination is to be modified out of plural logic gates in the semiconductor integrated circuit which has been subjected to the layout design, based on physical location relationships of the plural logic gates in the semiconductor integrated circuit; transforming selected logic gates into a logically equivalent intermediate representation; modifying the intermediate representation; generating a new combination circuit of the selected logic gates based on the modified intermediate representation; and carrying out layout design of the new combination circuit in the semiconductor integrated circuit.

In the preferred embodiment of the present invention, the intermediate representation comprises basic logic gates which are placed.

In the preferred embodiment of the present invention, the intermediate representation is modified based on an evaluation index.

In the preferred embodiment of the present invention, the intermediate representation is modified based on an evaluation index.

In the preferred embodiment of the present invention, estimation of physical properties due to routings is carried out according to locations of basic logic gates which have been placed, and the intermediate representation is modified by using the estimation as the evaluation index.

In the preferred embodiment of the present invention, estimation of a routing complexity degree is carried out based on relationships between locations of the basic logic gates which have been placed and locations of the logic gates in the semiconductor integrated circuit other than the logic gates whose combination has been modified, and the intermediate representation is modified by using the estimation as the evaluation index.

In the preferred embodiment of the present invention, upon transforming the selected logic gates into the logically equivalent intermediate representation, the selected logic gates are transformed into plural intermediate representations, then the evaluation index is predicted as to the plural intermediate representations respectively, and one of the plural intermediate representations is selected based on respective predicted evaluation indices.

In the preferred embodiment of the present invention, boundary conditions of placement of the basic logic gates constituting the intermediate representations are calculated based on relationships between locations of the basic logic gates which have been placed and locations of the logic gates in the semiconductor integrated circuit other than the logic gates whose combination has been modified, then the placement of the basic logic gates constituting the intermediate representations is determined based on the boundary conditions, and then placement of the new combination circuits is determined based on the placement of the basic logic gates constituting the intermediate representations when a new combination circuit of the selected logic gates is generated based on the intermediate representations.

In the preferred embodiment of the present invention, logically replaceable input signals to the basic logic gates are extracted when the basic logic gates constituting the intermediate representations are to be modified based on the evaluation index, allowable logic depths of extracted logically replaceable input signals, which are signal passing logic depths being permissible based on predetermined evaluation index, are calculated respectively as to logic depths of the basic logic gates from the input signal to output signal of the intermediate signals, an expected logic depth which can be expected from a current number of the logically replaceable input signals on an average and is a logic depth of the basic logic gates passing through up to an output terminal is calculated and the allowable logic depths and the expected logic depth are compared with each others and then inputs to the basic logic gates are determined based on other evaluation indices different from the evaluation index if the allowable logic depths are larger than the expected logic depth, or the logically replaceable input signals having larger allowable logic depths are selected as inputs to the basic logic gates if the allowable logic depths are smaller than the expected logic depth with respect to all the logically replaceable input signals.

According to another aspect of the present invention, there is provided a semiconductor device manufacturing method comprising the steps of specifying circuits to be subjected to logic resynthesis in a semiconductor integrated circuit; intermediately representing the circuits to be subjected to the logic resynthesis in terms of trees consisting of two-input NAND circuits and inverter circuits; placing the two-input NAND circuits and the inverter circuits; restructuring the trees consisting of the two-input NAND circuits and the inverter circuits by using predetermined evaluation indices as criteria; re-placing the trees consisting of the two-input NAND circuits and the inverter circuits which have been restructured; enerating a new logic gate circuit based on the trees consisting of the two-input NAND circuits and the inverter circuits which have been re-placed; generating a new connectivity list in which the circuits to be subjected to the logic resynthesis are replaced with the new logic gate circuit; and deleting the circuits to be subjected to the logic resynthesis from a layout list and then automatically placing the new logic gate circuit in the semiconductor integrated circuit.

According to the present invention, only a part of the circuit is transformed into the intermediate representation at need after the layout design process, then logic resynthesis of the circuit portion is carried out, and then the layout design process is carried out once again. Therefore, the results of logic synthesis and the results of layout design in circuit portions other than the logic-resynthesized circuit portion are not affected by such logic resynthesis at all. In other words, unnecessary repetition of the logic synthesis process and the layout process to which no guarantee of convergence is offered can be avoided. In addition, since the basic logic gates as the intermediate representation are placed based on the results of layout design of the circuit before modification and then routing complexity degree, physical property due to routing, etc. are calculated based on such information, influence of routing in layout can be estimated precisely in the middle of the logic synthesis process and thus better results of logic synthesis with better evaluation indices can be achieved. When the logic gates used in the semiconductor integrated circuit are represented intermediately in terms of the basic logic gates, plural intermediate representations are prepared for respective logic gates and then evaluation indices for the final results of logic synthesis of respective intermediate representations are predicted in response to layout conditions of the circuits to be transformed. As a result, the intermediate representations with good evaluation indices can be selected and therefore the results of logic synthesis with better evaluation indices can be obtained.

In placing the basic logic gates used as the intermediate representation, boundary conditions of locations of the basic logic gates used as the intermediate representation are calculated based on the relationship between placement of the original logic gates and placement of the circuit portions which are not the object to be modified for combination of the logic gates, and placement of the basic logic gates used as the intermediate representation is determined based on the boundary conditions. As a result, layout conditions can be simply taken into account during the logic synthesis process and also the intermediate representations with good evaluation indices can be selected and therefore the results of logic synthesis with better evaluation indices can be obtained.

If the intermediate representations are modified to mate with the evaluation indices, there can be increased considerably a possibility of generating the logic circuits being different from the original circuits. As a result, the results of logic synthesis with better evaluation indices can be obtained.

In modifying the intermediate representations to mate with the evaluation indices, the allowable logic depth which is the signal passing logic depth being allowed based on a certain evaluation index and the expected logic depth which is the average signal passing logic depth being expected based on the input signal number are calculated, and then a combination of the input signals is decided based on another evaluation index if there are the input signals to which the allowable logic depth is larger than the expected logic depths, or the input signals to which the larger allowable logic depth is assigned are sequentially combined if the allowable logic depths with respect to all the input signals are smaller than the expected logic depths. As a result, the intermediate representations can be modified to improve a plurality of evaluation indices and in its turn the results of logic synthesis with better evaluation indices can be obtained.

The nature, principle and utility of the invention will become more apparent from the following detailed description when read in conjunction with the accompanying drawings.

BRIEF DESCRIPTION OF THE DRAWINGS

In the accompanying drawings:

FIG. 7 is a flowchart illustrative of the details of the process in FIG. 4 in which placement of NAND2s and IVs is carried out;

FIG. 11 is a flowchart illustrative of the process in FIG. 4 in which the trees consisting of NAND2s and IVs are restructured;

FIGS. 12A–12C are circuit diagram showing a concrete example of the process of restructuring the trees consisting of NAND2s and IVs in FIG. 4;

FIGS. 13A–13C are circuit diagrams showing the basic logic gates constituting intermediate representation;

DESCRIPTION OF THE PREFERRED EMBODIMENTS

Embodiments of the present invention will be explained with reference to accompanying drawings hereinafter.

Figure 1:
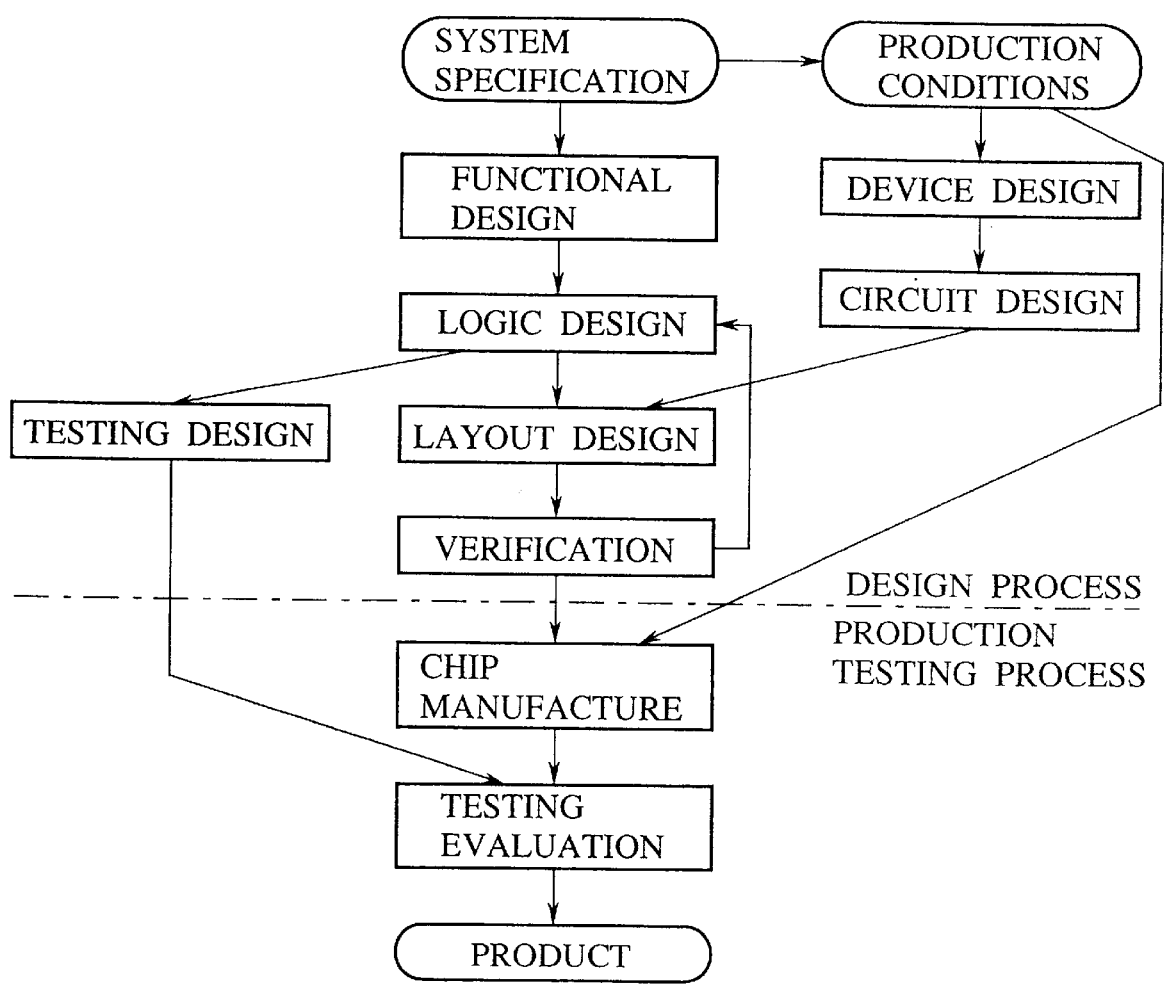
FIG. 1 is a flowchart illustrative of production process of a semiconductor device in the prior art.
Figure 2:
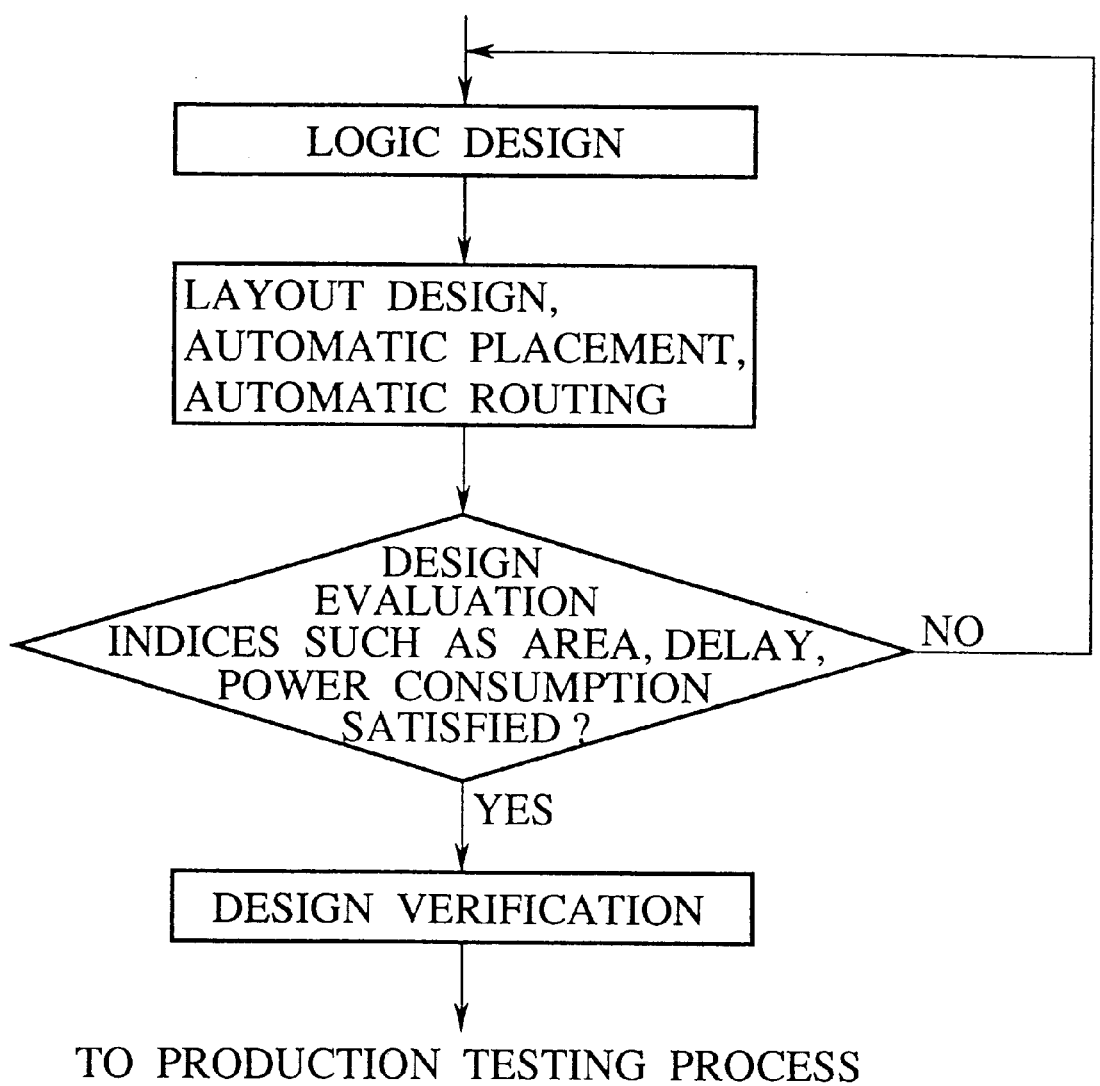
FIG. 2 is a detailed flowchart illustrative of a part of production process of the semiconductor device in the prior art.

As described previously conventional design and production processes of the semiconductor integrated circuit are carried out in compliance with a flowchart in FIG. 1. Especially, the details of logic design process, succeeding layout process and design verification follow the procedures shown in FIG. 2. That is, the process proceeds to the layout design process after the logic design process has been terminated. Then, it is verified whether or not design evaluation indices, for example, area, delay, power consumption, etc. are satisfied after the layout design process such as automatic placement, automatic routing, etc. has been completed. The process then returns to the logic design process if such design evaluation indices are not satisfied, while the process then advances to the production testing process if such design evaluation indices are satisfied.

Figure 3:
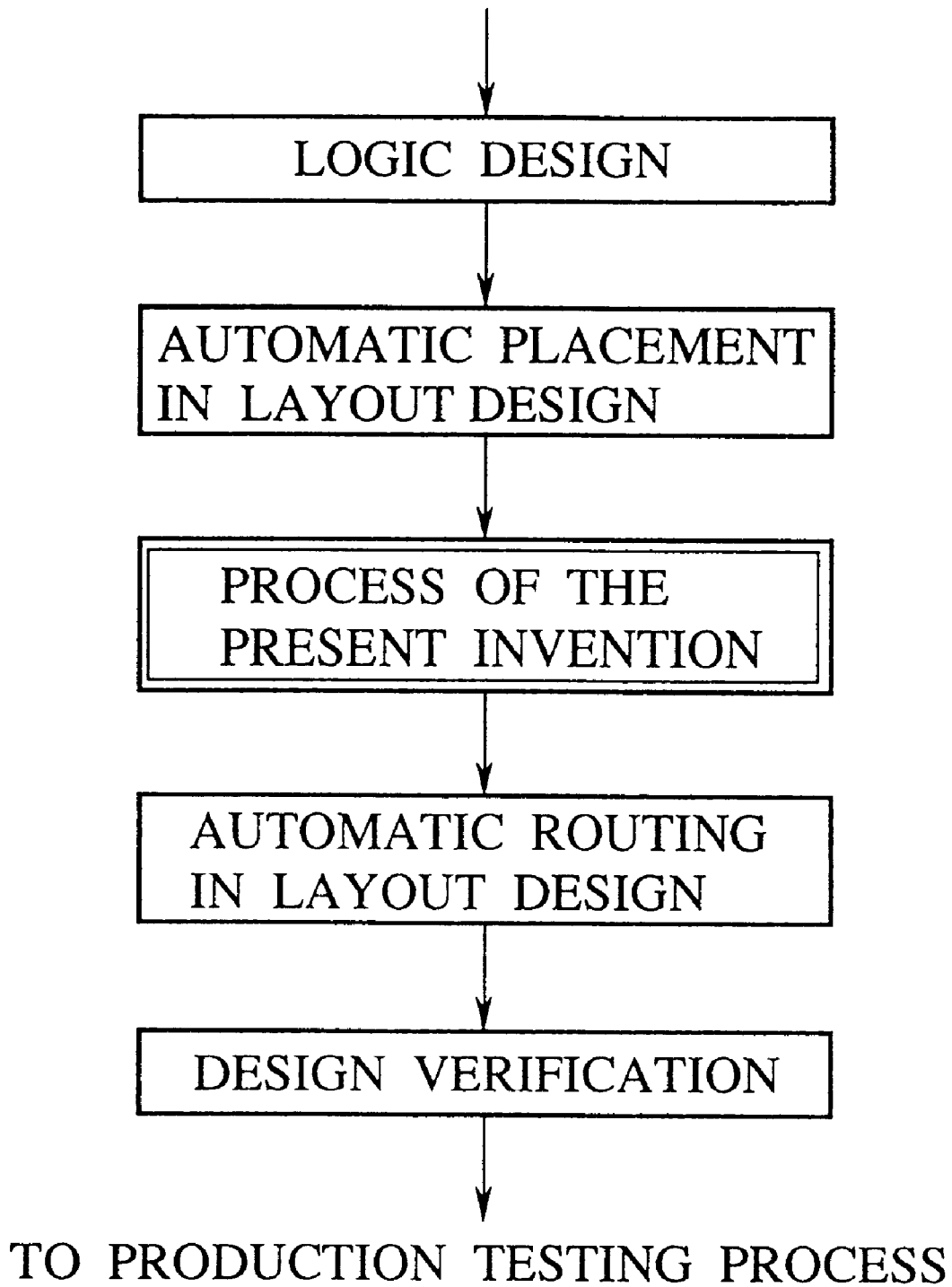
FIG. 3 is a view showing the situation of the present invention throughout production processes of the semiconductor device.

As shown in FIG. 3, the present invention can be situated throughout the design processes of the semiconductor device. This indicates that the process of the present invention may be applied to the logic design process and the layout design process in the conventional design processes shown in FIG. 2. As shown in FIG. 3, the process of the present invention will be carried out at the stage that automatic placement in the layout design process has been terminated. The reasons why the process of the present invention will be carried out at this stage are that estimation of the results of routing can be facilitated if such automatic placement has been finished, and that estimation of increase in area due to routing, increase in delay time due to routing, and increase in power consumption caused to drive wiring capacitance, for example, can also be facilitated. Such area, delay time, and power consumption are evaluation indices for the semiconductor integrated circuit.

Figure 4:
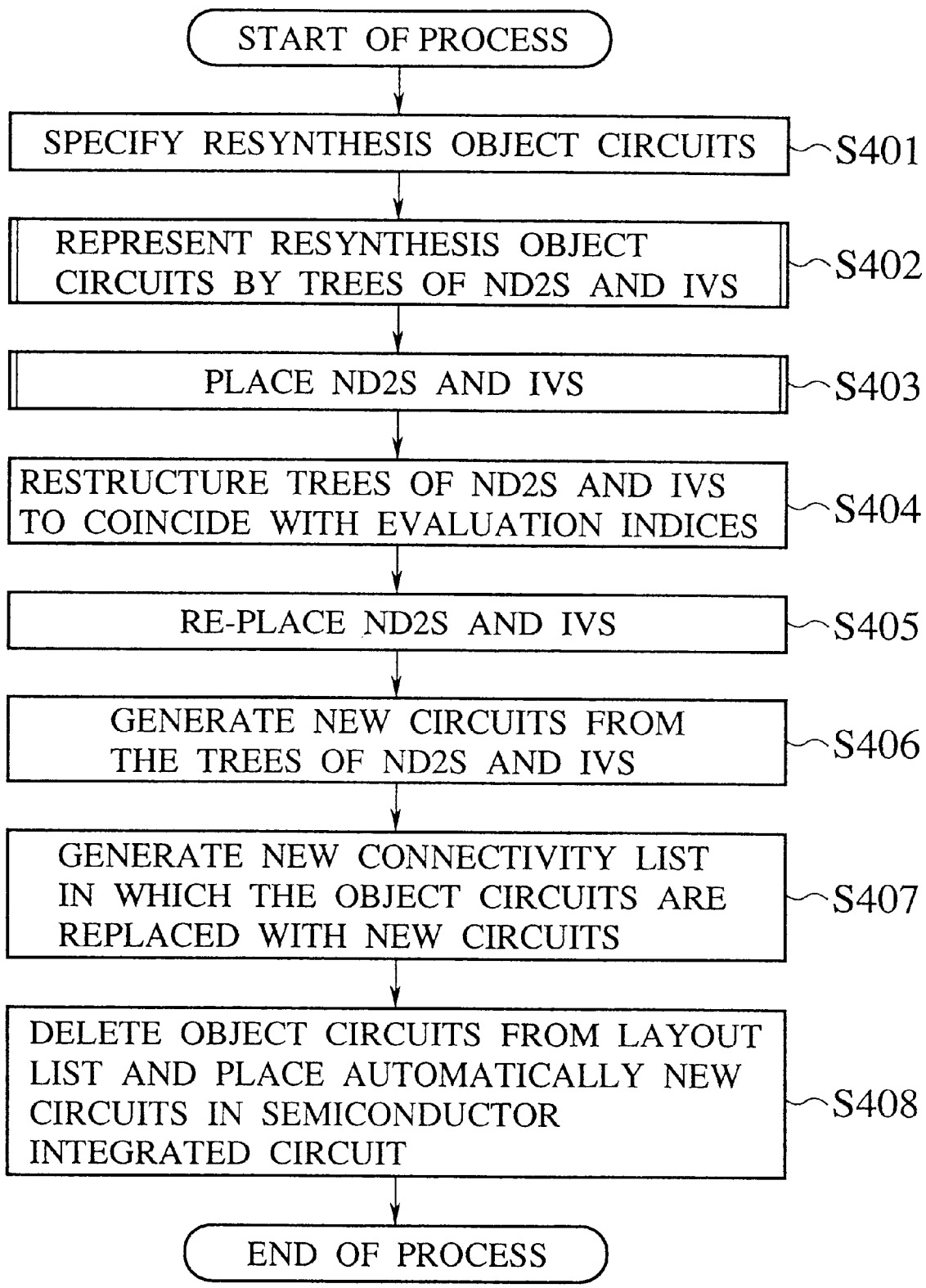
FIG. 4 is a flowchart illustrative of processes of a semiconductor device manufacturing method according to an embodiment of the present invention.

Next, the detailed procedures of the process according to an embodiment of the present invention will be explained with reference to a flowchart in FIG. 4. In the embodiment of the present invention, logic gates are intermediately represented by trees consisting of two-input terminal NAND circuits (referred to as "NAND2s" hereinafter) and inverter circuits (referred to as "IVs" hereinafter), which may serve as a means for modifying a combination of logic gates, and then logic resynthesis is carried out by using such intermediate representation. This approach can attain such advantages that high speed logic synthesis can be done because logic synthesis (technology mapping) itself is effected according to a DAG mapping-based algorithm, representation of the logic gates in terms of trees consisting of NAND2s and IVs can be facilitated, and current layout conditions (routing conditions) can be easily reflected on the logic synthesis process if the NAND2s and the IVs are placed based on original locations of the logic gates.

The semiconductor integrated circuit of the present invention are processed according to procedures consisting of following steps S401 to S408.

Step S401: Logic resynthesis object circuits (referred to as "object circuits" hereinafter) in the semiconductor integrated circuit are specified.

Step S402: The object circuits are represented intermediately in terms of trees consisting of NAND2s and IVs.

Step S403: The NAND2s and IVs are placed.

Step S404: The trees consisting of NAND2s and IVs are restructured to coincide with predetermined evaluation indices.

Step S405: The NAND2s and IVs are re-placed.

Step S406: New logic gate circuits are generated from the re-placed trees consisting of NAND2s and IVs.

Step S407: A new connectivity list in which the object circuits are replaced with new logic gate circuits is generated.

Step S408: The object circuits are deleted from layout list and new logic gate circuits are automatically placed in the semiconductor integrated circuit.

At first, in specifying the logic resynthesis object circuits in the semiconductor integrated circuit (S401), the semiconductor circuit portions with bad evaluation indices must be selected. For instance, in the case that areas delay times and power consumption should be considered as the evaluation indices, a circuit portion including the logic gates which are placed in the area having the high routing complexity degree, a circuit portion including the logic gates in which a long delay time is caused, a circuit portion including the logic gates in which high power consumption is caused, or the like may be selected as the object circuits.

Figure 5:
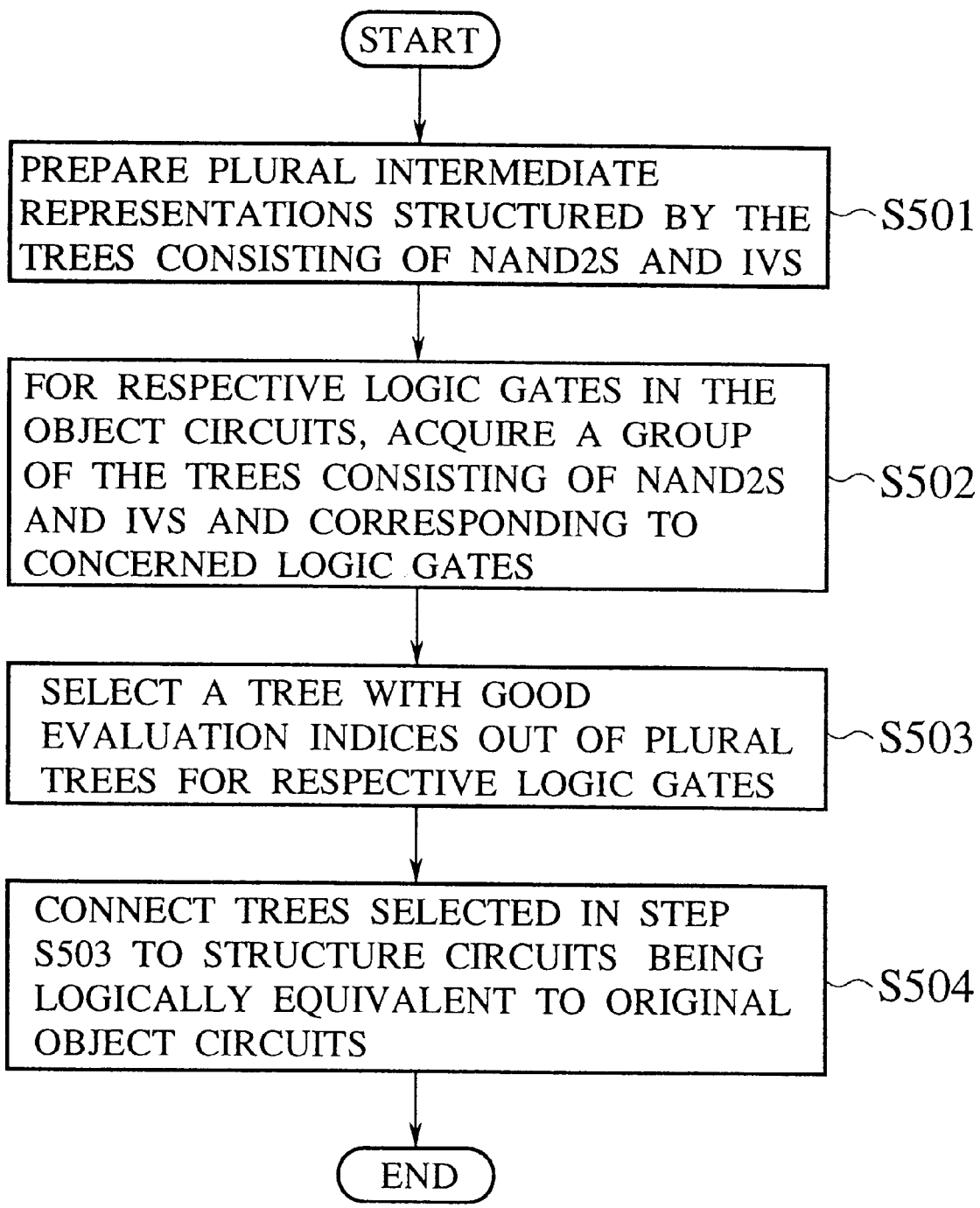
FIG. 5 is a flowchart illustrative of the details of the process in FIG. 4 in which a logic resynthesis object circuit is represented by trees consisting of NAND2s and IVs.

Subsequently, the object circuits are intermediately represented in terms of the trees consisting of NAND2s and IVs according to detailed procedures shown in FIG. 5 (S402). The trees consisting of NAND2s and IVs are structured in accordance with following steps S501 to S504.

Step S501: A plurality of intermediate representations are prepared which are structured by the trees consisting of NAND2s and IVs corresponding to (i.e., logically equivalent) respective logic gates.

Step S502: For respective logic gates in the object circuits, a group of the trees consisting of NAND2s and IVs and corresponding to concerned logic gates are selected.

Step S503: Since generally plural trees are selected for respective logic gates in Step S502, one tree with good evaluation indices for respective logic gates is selected out of the plural trees.

Step S504: Respective trees selected in Step S503 are connected to structure circuits being logically equivalent to the original object circuits.

Figure 6A:
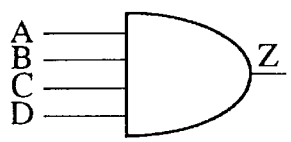
FIGS. 6A–6C are circuit diagrams showing how the trees having good evaluation indices are selected out of plural trees in FIG. 5.
Figure 6B:
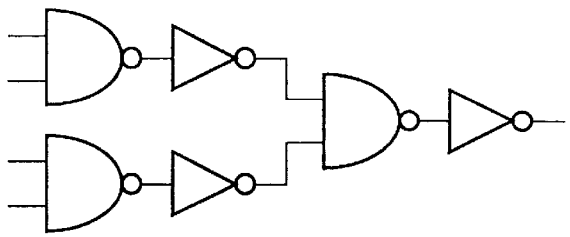
Figure 6C:
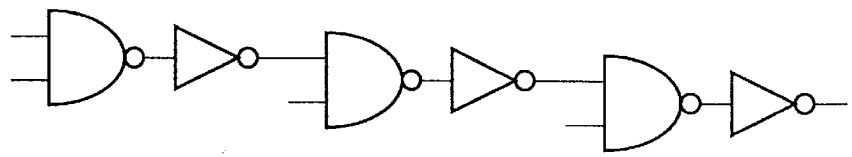

It will then be explained with reference to FIG. 6 how trees with good evaluation indices are selected out of plural trees which are selected in Step S502 (S503). By way of example, signal propagation delay is employed as an evaluation index. Assuming that, as shown in (a) of FIG. 6, the concerned logic gate is a four-input AND circuit (referred to as "AND4" hereinafter). If there is no difference in signal propagation delay between the signals which are input into input terminals A, B, C, D of the AND4, it is preferable to select the intermediate representation 1 which is shown in (b) of FIG. 6 and indicates a balanced tree. For it has a good evaluation index to delay in representing intermediately the logic gate in terms of NAND2 and IV and further logic synthesis with a good evaluation value to delay may be expected in respect of logic resynthesis. On the contrary, if there are considerable differences in signal propagation delay between the signals which are input into the input terminals A, B, C, D of the AND4, the intermediate representation 2 shown in (c) of FIG. 6 should be selected so as to absorb variations of signal propagation delay in this intermediate representation. Such selection makes it possible to have a better evaluation index of delay in the intermediate representation in terms of NAND2 and IV structures and also makes it possible to expect mapping with a better evaluation value of delay in respect of logic resynthesis. Of course, the trees may be selected by using other evaluation values as criteria.

In turn, a way by which NAND2s and IVs selected in Step S402 are placed will be explained (S403). Placements of NAND2s and IVs are carried out according to following steps S701 to S703 shown in FIG. 7.

Step S701: Locations of logic gates which are adjacent to the object circuit and are not transform objects are set to (a1, b1) (a2, b2) . . . , (an, bn) These coordinate values have already been decided.

Step S702: Coordinate values of NAND2s and IVs which have not been decided yet are set to (x1, y1) (x2, y2), . . . , (xk, yk).

Step S703: For respect NAND2s and IVs, differences in location coordinates between a respect NAND2 and IV and adjacent NAND2s and IVs or logic gates which are not transform objects are generated as force vectors.

At this time, the coordinate values (x1, y1), (x2, y2), . . . , (xk, yk) are determined such that a total sum of force vectors which are generated with respect to NANDs and IVs becomes zero.

Figure 8:
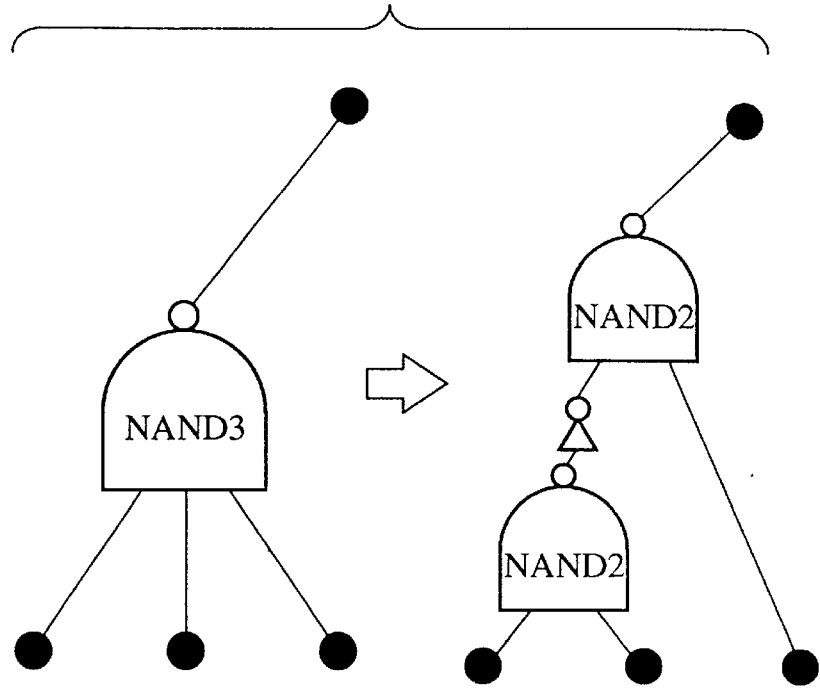
FIG. 8 is a circuit diagram showing how placement of NAND2s and IVs is carried out in FIG. 7.
Figure 9:
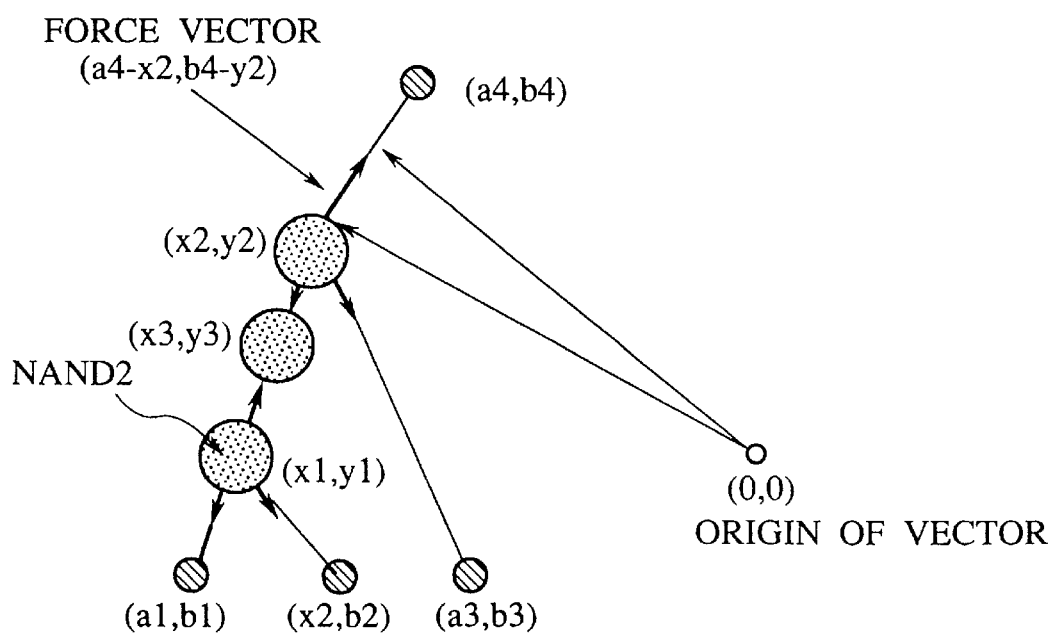
FIG. 9 is a vector diagram showing how placement of NAND2s and IVs is carried out in FIG. 7.

The above placement will be explained with reference to a schematic circuit diagram of the logic gates in FIG. 8 and a vector diagram in FIG. 9. First of all, location coordinates of the trees consisting of NAND2s and IVs which constitute a three-input NAND circuit (referred to as "NAND3" hereinafter) and thus is logically equivalent to it are supposed. Then, with respect to z and y coordinates, simultaneous equations of force vector are formulated in the following:

$$(a4-x2)+(x3-x2)+(a3-x2)=0 \qquad (1)$$

$$(x2-x3)+(x1-x3)=0 \qquad (2)$$

$$(x3-x1)+(a1-x1)+(a2-x1)=0 \qquad (3)$$

$$(b4-y2)+(y3-y2)+(b3-y2)=0 \qquad (4)$$

$$(y2-y3)+(y1-y3)=0 \qquad (5)$$

$$(y3-y1)+(b1-y1)+(b2-y1)=0 \qquad (6)$$

By solving Eqs. (1) to (6), location coordinates of NAND2s and IVs are decided.

Figure 10:
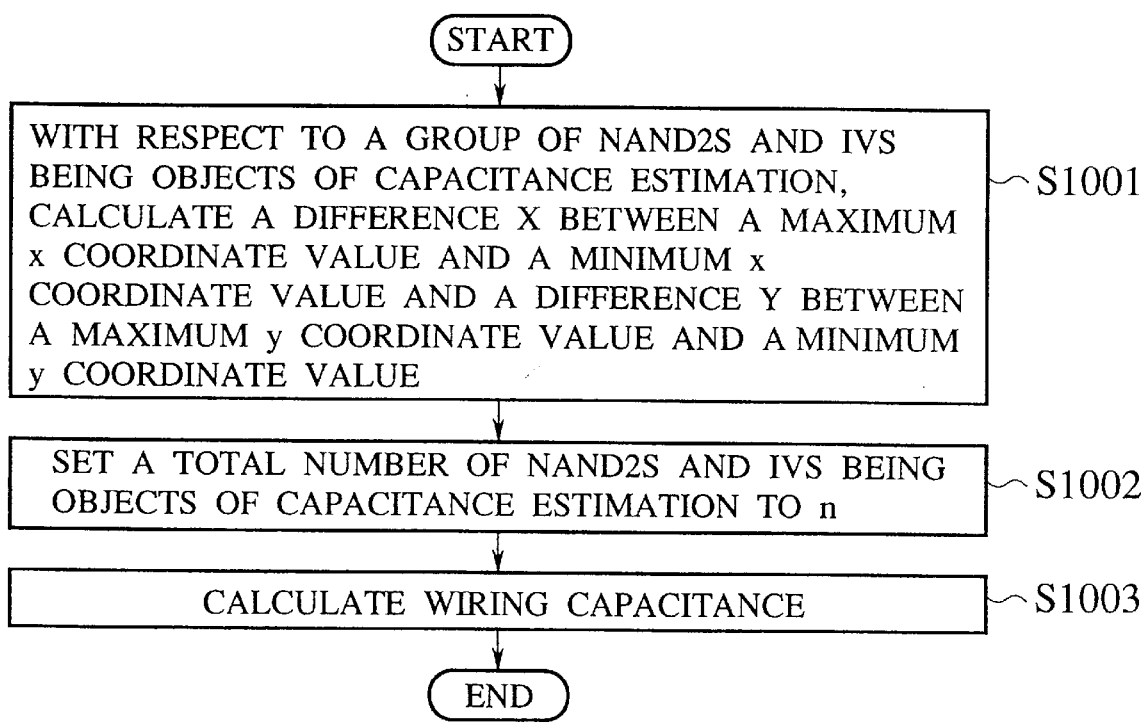
FIG. 10 is a flowchart illustrative of the process in FIG. 4 in which capacitance calculation necessary for restructuring the trees consisting of NAND2s and IVs is estimated.

Next, the trees consisting of NAND2s and IVs are restructured to coincide with predetermined evaluation indices (S404). In representation of the tree in the preceding process step, the way has been explained by which one intermediate representation is selected out of intermediate representations of the plural trees constituting respective logic gates (S402, S503). While restructuring of the trees which can be derived by grafting plural trees made originally of plural logic gates will be explained in this process. First one estimation way of capacitance calculation which is necessary for restructuring of such trees will be explained. This estimation way is advanced in compliance with following steps S1001 to S1003, as shown in FIG. 10.

Step S1001: With respect to a group of NAND2s and IVs being objects of capacitance estimation, a difference X between a maximum x coordinate value and a minimum x coordinate value and a difference Y between a maximum y coordinate value and a minimum y coordinate value are calculated.

Step S1002: A total number of NAND2s and IVs being objects of capacitance estimation is set to n.

Step S1003: Wiring capacitance ((wiring capacitance per unit length of AL1)×X/$n^{1/2}$+(wiring capacitance per unit length of AL2)×Y/$n^{1/2}$) is calculated. This calculation is used to estimate wiring capacitance if it is not clear how a combination of NAND2s would be changed thereafter. Where AL1 denotes a first layer aluminum wiring formed on the chip and AL2 denotes a second layer aluminum wiring formed on the chip.

Subsequently, a method of restructuring the trees consisting of NAND2s and IVs will be explained. This restructuring method is used, for example, to improve other evaluation values under a constraint that signal propagation delay is suppressed less than a certain value. It would be evident that other embodiments employing evaluation values other than signal propagation delay as constraints may be achieved. This restructuring method will be carried out in accordance with following steps S1101 to S1111 as shown in FIG. 11.

Step S1101: Logically replaceable input signals are investigated and the number of the input signals is set to N. Partial trees consisting of NAND2s and IVs from input signals to output signals are extracted.

Step S1102: As for partial trees extracted in Step S1101, capacitances are calculated by virtue of the above estimation way of capacitance.

Step S1103: Delay per one stage consisting of NAND2 and IV is calculated based on the obtained capacitance.

Step S1104: As for respective input signals, allowable logic depth is calculated by the following equation.

Allowable logic depth=(restricted delay time of output signal−arrival time of input signal)/delay per one stage of NAND2+IV Step S1105: A repetitive number (represented as "cnt" hereinafter) is initialized to 0.

Step S1106: An expected value of logic depth from the input to the output is calculated according to the following equation.

$$\text{Expected logic depth} = \log_2(n-cnt)$$

Step S1107: If there exist two inputs or more to provide (allowable logic depth>expected logic depth), a pair of input signals to be input into one NAND2 is calculated so as to provide better evaluation indices other than signal propagation delay.

Step S1108: If all input to be processed satisfy (allowable logic depth≦expected logic depth), inputs having larger allowable logic depth are paired.

Step S1109: The allowable logic depths of calculated paired inputs are calculated according to the following equation once again.

Allowable logic depth=min(allowable logic depth of inputs)−1

Step S1110: The pairs which are calculated from the group of input to be processed are removed respectively and then new paired outputs obtained in Step S1109 are registered as new inputs to be processed.

Step S1111: If the inputs to be processed are present still further, repetitive number is counted up. Then the process returns to Step S1106.

Next, the process of restructuring trees consisting of NAND2s and IVs (S404) will be explained concretely with reference to a logic circuit diagram in FIG. 12. In (a) of FIG. 12, there is shown an example of a logic gate comprising a combination of a two-input NOR circuit (referred to as "NOR2" hereinafter), a three-input AND circuit (referred to as "AND3" hereinafter), and two inverters. All the input signals A, B, C, D to the logic gate which is formed of a combination of the two-input NOR circuit, the three-input AND circuit, and two inverters are logically replaceable signals. Assuming that a restricted delay time assigned to an output signal is 6 (the unit is nsec, for example. The same is true hereinafter.), and arrival times of input signals A, B, C, D are set to 5, 2, 3, 1 respectively. In addition, delay per one stage of NAND2 and IV is set to 1. The logic gate in (a) of FIG. 12, if represented by the intermediate representation, is given as shown in (b) of FIG. 12.

The expected logic depth at the initial stage of the process can be derived from the Eq. in step S1106 as 2. As shown in (a) of FIG. 12, the allowable logic depth for respective input signals A, B, C, D can be derived from the Eq. in step S1106 as 1, 4, 3, 5 respectively. At this stage, since the input signals to provide expected logic depth<allowable logic depth are B, C, and D, these signals are paired with regard to other evaluation indices. For instance, the input signals B and C are paired. The process is then repeated and finally the result can be obtained as shown in (c) of FIG. 12. If the logic gate is constituted in this manner, the output signal can be output within the restricted delay time of 6.

Upon generating new circuits in Step S406, locations of the circuits are calculated from center-of-gravity locations of the original NAND2s and IVs. In addition, evaluation indices such as wiring capacitance, routing complexity degree can be estimated based on locations of NAND2s and IVs.

As stated earlier, the semiconductor device manufacturing method of the present invention comprises the steps of carrying out logic design of the semiconductor integrated circuit including logic gates, selecting circuits portions in which a combination of the logic gates of the semiconductor integrated circuit which is subjected to the logic design is modified, transforming the circuit portions into logically equivalent intermediate representation, generating a new combination circuit of the circuit portions based on the intermediate representation, and carrying out layout design of the new combination circuit in the semiconductor integrated circuit which is subjected to the logic design, whereby the combination of the logic gates is modified based on physical location relationship of the logic gates in the semiconductor integrated circuit which has already been subjected to the layout design.

Figure 13A:
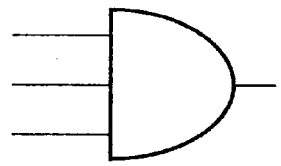
Figure 13B:
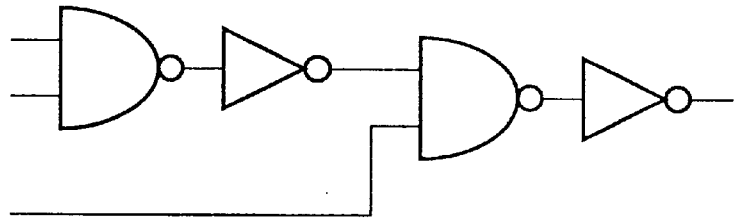

In the present invention, the intermediate representation can be expressed in terms of basic logic gates shown in (c) of FIG. 13, for example. As explained previously, a new combination circuit is generated based on the logic gate AND3 shown in (a) of FIG. 13, for instance. The intermediate representation for the new combination circuit is composed of two NAND2s and two IVs, as shown in (b) of FIG. 13. As shown in (c) of FIG. 13, particularly EXor, AND, NOR, etc. in addition to NAND and IV may be used as the basic logic gates.

Figure 14A:
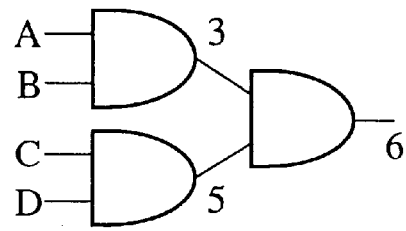
FIGS. 14A to 14C are circuit diagrams showing concrete examples of the process of modifying the intermediate representation based on an evaluation index.
Figure 14B:
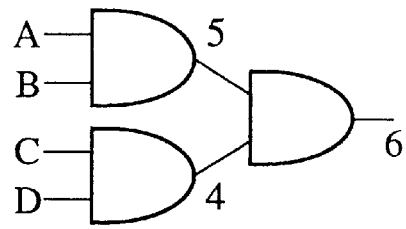
Figure 14C:
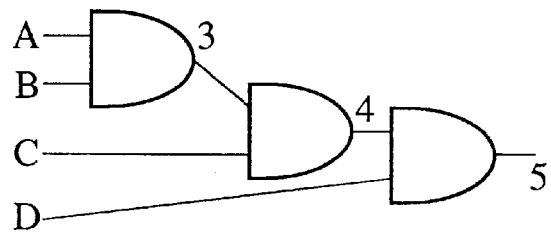
Figure 15A:
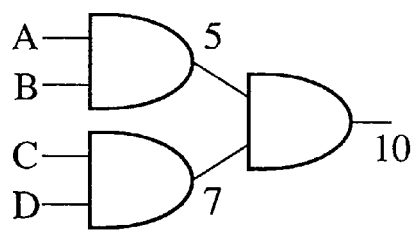
FIGS. 15A to 15C are circuit diagrams showing another concrete examples of the process of modifying the intermediate representation based on an evaluation index.
Figure 15B:
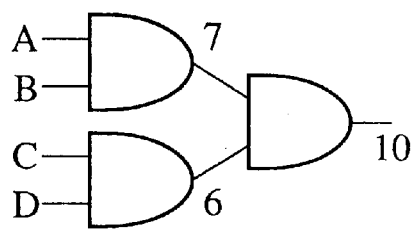
Figure 15C:
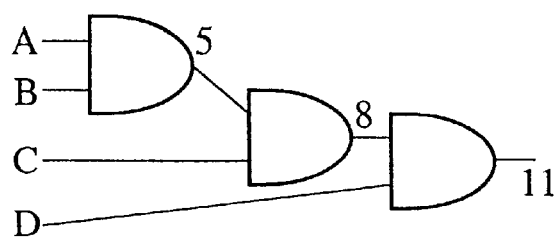

Subsequently, particular examples of the process of modifying the intermediate representations to mate with the evaluation indices will be explained. The logic gates in FIGS. 14A to 14C and FIGS. 15A to 15C in which basic logic gates are made up of two-input AND circuits (referred to as "AND2" hereinafter) are used to optimize delay by using the delay as the evaluation index. As preprocessing for restructure, input terminals which receive logically replaceable input signals A, B, C, D are extracted. Arrival times from starting points of respective input signals to the input terminals are set previously. As the arrival times, 1, 2, 3, 4 are assigned to the input signals A, B, C, D respectively. Assuming that there caused internal delay of 1 per one stage of AND2 in the logic gates in FIGS. 14A to 14C and that there caused internal delay of 3 per one stage of AND2 in the logic gates in FIGS. 15A to 15C. Then, elapsed times from the inputs to the outputs of respective logic gates are detected. In FIGS. 14A to 14C, the logic gates in FIGS. 14A and 14B take the elapsed time of 6 and the logic gate in FIG. 14C takes the elapsed time of 5. In FIGS. 15A to 15C, the logic gates in FIGS. 15A and 15B take the elapsed time of 10 and the logic gate in FIG. 15C takes the elapsed time of 11. In the event that the arrival times from the starting points are assigned to the input terminals, in order to structure the logic gates such that arrival times to the outputs are made smaller than required times, the logic gate in FIG. 14C should be selected throughout FIGS. 14A to 14C and the logic gate in FIG. 15A or FIG. 15B should be selected throughout FIGS. 15A to 15C. It is determined according to other evaluation indices which logic gate in FIG. 15A or FIG. 15B should be selected.

Figure 16A:
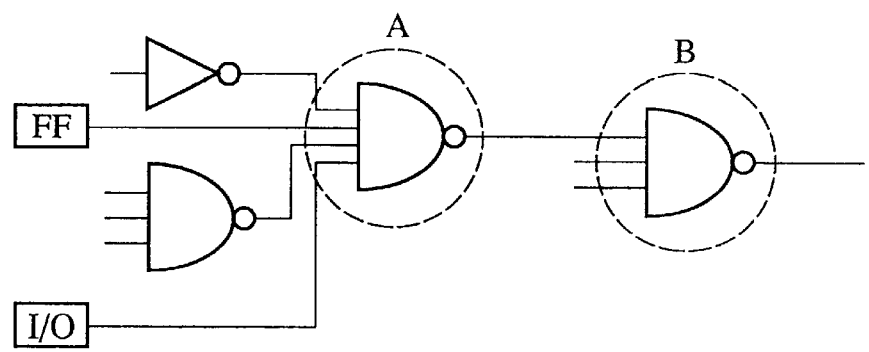
FIGS. 16A–16B are circuit diagrams showing concrete examples of the process of placing the basic logic gates constituting the intermediate representation.
Figure 16B:
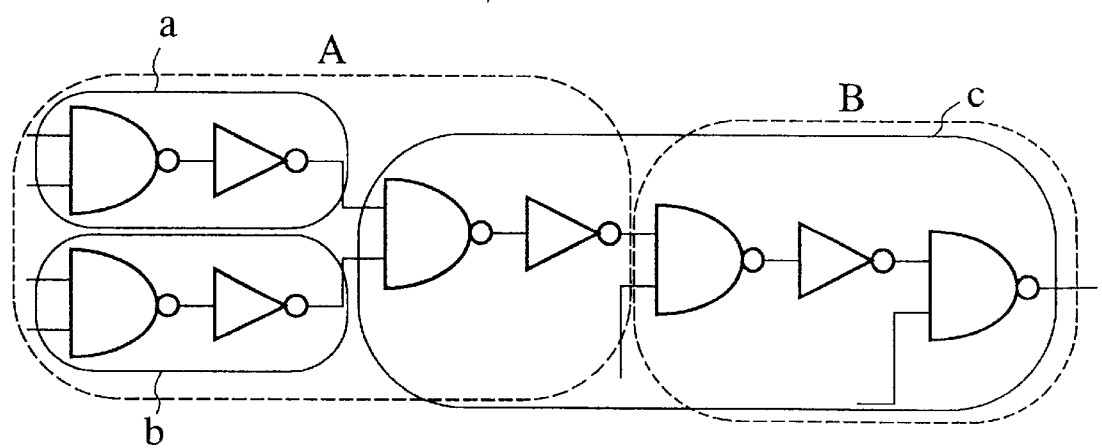

Then, particular examples of the process of placing the basic logic gates used as the intermediate representation will be explained with reference to FIG. 16. In placing the basic logic gates used as the intermediate representation, boundary conditions of locations of basic logic gates used as the intermediate representation are calculated based on the relationship between placement of the original logic gates and placement of the circuit portions which are not the object to be modified for combination of the logic gates, and placement of the basic logic gates used as the intermediate representation is determined based on the boundary conditions. Then, in resynthesizing the logic gates from the intermediate representation, placement of the logic gates which is synthesized from placement of the basic logic gates constituting the intermediate representations is decided. As shown in (a) of FIG. 16, the object circuit is composed of AND4(A) and AND3(B), for example. Input terminals of the logic gate A are connected to the IV, the flip-flop circuit, the NAND3 and the I/O buffer As shown in (b) of FIG. 16, with regard to the object circuit consisting of the logic gate A and the logic gate B, locations of nine basic logic gates are decided based on placement of the circuit portion which is not to be modified on the chip. As the object circuit, three logic gates (a, b, c) are resynthesized according to location relationships and also the locations of resynthesized logic gates are decided.

Figure 17A:
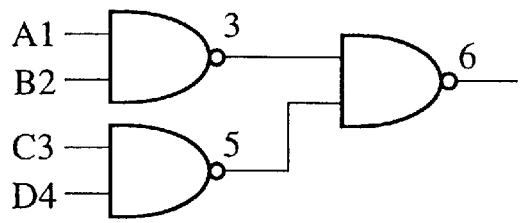
FIGS. 17A and 17B are circuit diagrams showing still another concrete examples of the process of modifying the intermediate representation based on an evaluation index.

In the next, another particular examples of the process of modifying intermediate representation to mate with the evaluation indices will be further explained with reference to FIGS. 17A and 17B. First, input terminals which can receive the logically replaceable input signals to the basic logic gates are extracted. As with the logic depth of the basic logic gates through which the signals are passed from the inputs to the outputs of the intermediate representation for respective input signals, the allowable logic depth which is the passing logic depth being allowed based on predetermined evaluation indices is calculated, then the expected logic depth which can be expected by the current input signal number on an average to be passed through by the signal until the output is calculated, and then inputs to the basic logic gates are decided according to other evaluation indices being different from predetermined evaluation indices if the allowable logic depth is larger than the expected logic depths when the allowable logic depth and the expected logic depth are compared with each other, or the input signals to which the larger allowable logic depth is assigned are selected as inputs to the basic logic gates if the allowable logic depths with respect to all the input signals are smaller than the expected logic depths. As the arrival times from starting points of respective input signals A, B, C, D to the input terminals, 1, 2, 3, 4 have been assigned to the input signals A, B, C, D respectively. This intermediate representation consists of three AND2s and one stage of respective AND2s would cause the delay of 1. Under this condition, modifications of the intermediate representations in terms of the basic logic gates are effected.

Procedures of modifications are 1) to impose constraint conditions on respective input terminals, 2) to select pairs to minimize another evaluation indices while satisfying the constraint conditions, and 3) to repeat the step 2) until all input terminals are incorporated into respective pairs.

In the first example, the input terminals which receive the input signals A, B, C, D having the above arrival times respectively are arranged such that the arrival times from the input terminals to the output terminals can be suppressed less than 6. Where the conditions are imposed as the constraints such that the input signal A must be output within 5, the input signal B must be output within 4, the input signal C must be output within 3, and the input signal D must be output within 2. Under these constraints, the intermediate representations are formed such that the arrival times become less than 6, as shown in FIG. 17A.

Figure 17B:
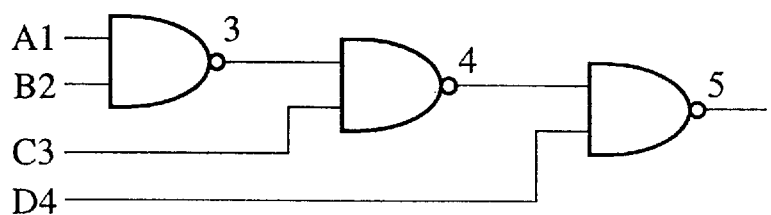

In the second example, the input signals A, B, C, D having the above arrival times respectively are arranged such that the arrival times at the output terminals can be suppressed less than 5, as shown in FIG. 17B. Where the conditions are imposed as the constraints such that the input signal A must be output within 4, the input signal B must be output within 3, the input signal C must be output within 2, and the input signal D must be output within 1. Under these constraints, the intermediate representations are formed such that the arrival times become less than 5, as shown in FIG. 17B.

The process of the present invention is carried out at the stage that the automatic placement in the layout design has been completed, as shown in FIG. 3. The reasons why the above process will be carried out at this stage are that estimation of the routing results can be facilitated if the automatic placement has been finished, and that estimation of increase in area due to routing, increase in delay time due to routing, increase in power consumption caused to drive wiring capacitance, etc. can also be facilitated.

Figure 18:
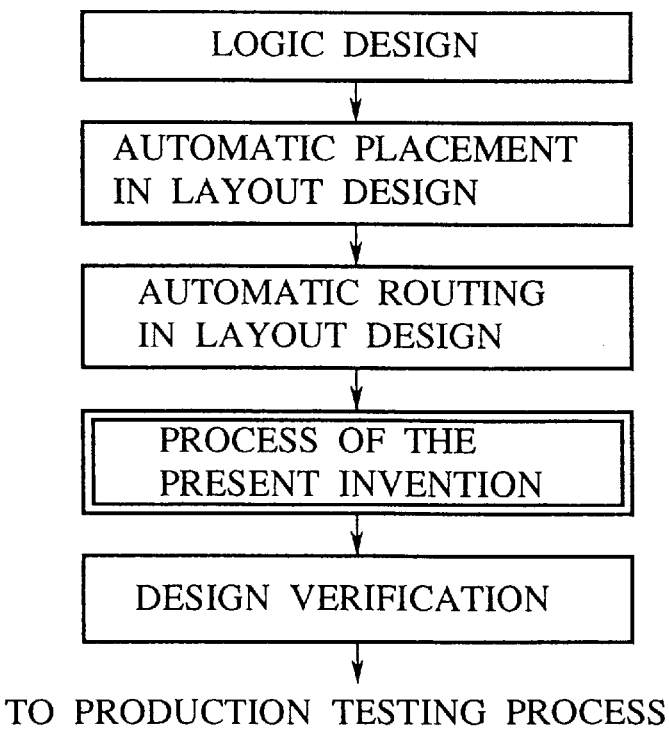
FIG. 18 is a view showing another situation of the present invention throughout manufacturing processes of the semiconductor device.

In the meanwhile, the situation of the present invention in respective design processes may be selected as shown in FIG. 18. In this case, the process of the present invention may be applied after the layout design process has been finished in the conventional design processes shown in FIG. 2.

According to the present invention, at the stage that automatic placement or automatic routing in layout design process has been finished, the logic resynthesis would be carried out while considering layout design states. Therefore, the evaluation indices for the semiconductor design can be estimated with good precision and in its turn the design of the semiconductor integrated circuit which permits a small area, high speed operation, and low power consumption can be accomplished.

According to the present invention, the signal propagation delay can also be reduced by 10 to 20% rather than the prior art, for instance.

It should be understood that many modifications and adaptations of the invention will become apparent to those skilled in the art and it is intended to encompass such obvious modifications and changes in the scope of the claims appended hereto.

What is claimed is:

1. A semiconductor device manufacturing method comprising the steps of:

carrying out logic design of a semiconductor integrated circuit including plural logic gates;

carrying out layout design of said semiconductor integrated circuit which is subjected to said logic design;

selecting logic gates whose combination is to be modified out of plural logic gates in said semiconductor integrated circuit which has been subjected to said layout design, based on physical location relationships of said plural logic gates in said semiconductor integrated circuit;

transforming selected logic gates into a logically equivalent intermediate representation;

modifying said intermediate representation;

generating a new combination circuit of said selected logic gates based on the modified intermediate representation; and carrying out layout design of said new combination circuit in said semiconductor integrated circuit.

2. A semiconductor device manufacturing method according to claim 1, wherein said intermediate representation comprises basic logic gates which are placed.

3. A semiconductor device manufacturing method according to claim 1, wherein said intermediate representation is modified based on an evaluation index.

4. A semiconductor device manufacturing method according to claim 2, wherein said intermediate representation is modified based on an evaluation index.

5. A semiconductor device manufacturing method according to claim 4, wherein estimation of physical properties due to routings is carried out according to locations of basic logic gates which have been placed, and said intermediate representation is modified by using said estimation as said evaluation index.

6. A semiconductor device manufacturing method according to claim 5, wherein estimation of a routing complexity degree is carried out based on relationships between locations of said basic logic gates which have been placed and locations of said logic gates in said semiconductor integrated circuit other than said logic gates whose combination has been modified, and said intermediate representation is modified by using said estimation as said evaluation index.

7. A semiconductor device manufacturing method according to claim 4, wherein, upon transforming said selected logic gates into said logically equivalent intermediate representation, said selected logic gates are transformed into plural intermediate representations, then said evaluation index is predicted as to said plural intermediate representations respectively, and one of said plural intermediate representations is selected based on respective predicted evaluation indices.

8. A semiconductor device manufacturing method according to claim 4, wherein boundary conditions of placement of said basic logic gates constituting said intermediate representations are calculated based on relationships between locations of said basic logic gates which have been placed and locations of said logic gates in said semiconductor integrated circuit other than said logic gates whose combination has been modified, then said placement of said basic logic gates constituting said intermediate representations is determined based on said boundary conditions, and then placement of said new combination circuits is determined based on said placement of said basic logic gates constituting said intermediate representations when a new combination circuit of said selected logic gates is generated based on said intermediate representations.

9. A semiconductor device manufacturing method according to claim 4, wherein logically replaceable input signals to said basic logic gates are extracted when said basic logic gates constituting said intermediate representations are to be modified based on said evaluation index, allowable logic depths of extracted logically replaceable input signals, which are signal passing logic depths being permissible based on predetermined evaluation index, are calculated respectively as to logic depths of said basic logic gates from said input signal to output signal of said intermediate signals, an expected logic depth which can be expected from a current number of said logically replaceable input signals on an average and is a logic depth of said basic logic gates passing through up to an output terminal is calculated, and said allowable logic depths and said expected logic depth are compared with each other, and then inputs to said basic logic gates are determined based on other evaluation indices different from said evaluation index if said allowable logic depths are larger than said expected logic depth, or said logically replaceable input signals having larger allowable logic depths are selected as inputs to said basic logic gates if said allowable logic depths are smaller than said expected logic depth with respect to all said logically replaceable input signals.

10. A semiconductor device manufacturing method comprising the steps of:

specifying circuits to be subjected to logic resynthesis in a semiconductor integrated circuit;

intermediately representing said circuits to be subjected to said logic resynthesis in terms of trees consisting of two-input NAND circuits and inverter circuits;

placing said two-input NAND circuits and said inverter circuits;

restructuring said trees consisting of said two-input NAND circuits and said inverter circuits by using predetermined evaluation indices as criteria;

re-placing said trees consisting of said two-input NAND circuits and said inverter circuits which have been restructured;

generating a new logic gate circuit based on said trees consisting of said two-input NAND circuits and said inverter circuits which have been re-placed;

generating a new connectivity list in which said circuits to be subjected to said logic resynthesis are replaced with said new logic gate circuit; and deleting said circuits to be subjected to said logic resynthesis from a layout list and then automatically placing said new logic gate circuit in said semiconductor integrated circuit.

* * * * *